(12) United States Patent
Suzuki et al.

(10) Patent No.: US 8,547,086 B2
(45) Date of Patent: Oct. 1, 2013

(54) COERCIVITY PERFORMANCE DETERMINATION DEVICE FOR COERCIVITY DISTRIBUTION MAGNET

(75) Inventors: Masafumi Suzuki, Aichi (JP); Mayumi Nakanishi, Anjo (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 0 days.

(21) Appl. No.: 13/816,004

(22) PCT Filed: Aug. 11, 2010

(86) PCT No.: PCT/JP2010/063604
§ 371 (c)(1),
(2), (4) Date: Feb. 8, 2013

(87) PCT Pub. No.: WO2012/020479
PCT Pub. Date: Feb. 16, 2012

(65) Prior Publication Data
US 2013/0141080 A1 Jun. 6, 2013

(51) Int. Cl.
*G01N 27/76* (2006.01)
(52) U.S. Cl.
USPC ...... 324/201; 324/205; 324/207.12; 324/226; 324/238; 324/260; 310/46; 310/154.26; 310/156.01; 310/156.34; 310/156.43; 361/143; 361/147; 361/267
(58) Field of Classification Search
USPC .......................................................... 324/201
See application file for complete search history.

(56) References Cited

U.S. PATENT DOCUMENTS

| | | | |
|---|---|---|---|
| 4,053,770 A | * | 10/1977 | Tanaka et al. ................. 250/324 |
| 4,056,770 A | | 11/1977 | Mohr et al. |
| 4,236,093 A | * | 11/1980 | Birnbaum ..................... 310/155 |

(Continued)

FOREIGN PATENT DOCUMENTS

| DD | 282 832 | 9/1990 |
|---|---|---|
| DE | 25 42 774 | 4/1977 |

(Continued)

*Primary Examiner* — Arleen M Vazquez
*Assistant Examiner* — Thang Le
(74) *Attorney, Agent, or Firm* — Finnegan, Henderson, Farabow, Garrett & Dunner, LLP

(57) ABSTRACT

There is provided a coercivity performance determination device for a coercivity distribution magnet that is capable of determining, in a short period of time, with precision, and at as low a testing cost as possible, whether or not each part of one coercivity distribution magnet has a coercivity that is equal to or greater than the required coercivity. A coercivity determining device of the present invention comprises: a substantially C-shaped magnetic body; excitation means that generates a magnetic flow in the magnetic body; and a flux meter that measures the residual magnetic flux of the coercivity distribution magnet. Protrusions are provided at corresponding positions on two opposing end faces of the magnetic body, and the coercivity distribution magnet is held between the two protrusions to form an annular magnetic circuit. An external magnetic field generation means is formed by magnetic regions caused by the protrusions and non-magnetic regions comprising the air in the periphery thereof. An external magnetic field that is generated when magnetism flows through the protrusions is adjusted in such a manner that a reverse magnetic field, which comprises the sum of the external magnetic field and the demagnetizing field of the coercivity distribution magnet, corresponds to the coercivity required of each part of the coercivity distribution magnet. The residual magnetic flux when this has acted as the reverse magnetic field is measured with the flux meter to determine coercivity performance.

5 Claims, 5 Drawing Sheets

(56) References Cited

U.S. PATENT DOCUMENTS

| | | | | |
|---|---|---|---|---|
| 6,141,571 | A * | 10/2000 | Dionne | 505/210 |
| 6,201,386 | B1 * | 3/2001 | Jones et al. | 324/205 |
| 6,323,634 | B1 * | 11/2001 | Nakagawa et al. | 324/117 R |
| 2003/0006758 | A1 * | 1/2003 | Takahashi | 324/201 |
| 2011/0080066 | A1 * | 4/2011 | Doi et al. | 310/156.43 |
| 2012/0091848 | A1 * | 4/2012 | Sakai et al. | 310/156.43 |

FOREIGN PATENT DOCUMENTS

| | | |
|---|---|---|
| DE | 33 30 164 | 4/1984 |
| DE | 33 24 955 | 1/1985 |
| JP | 2009-270926 | 11/2009 |

* cited by examiner (a)

(b)

(c)

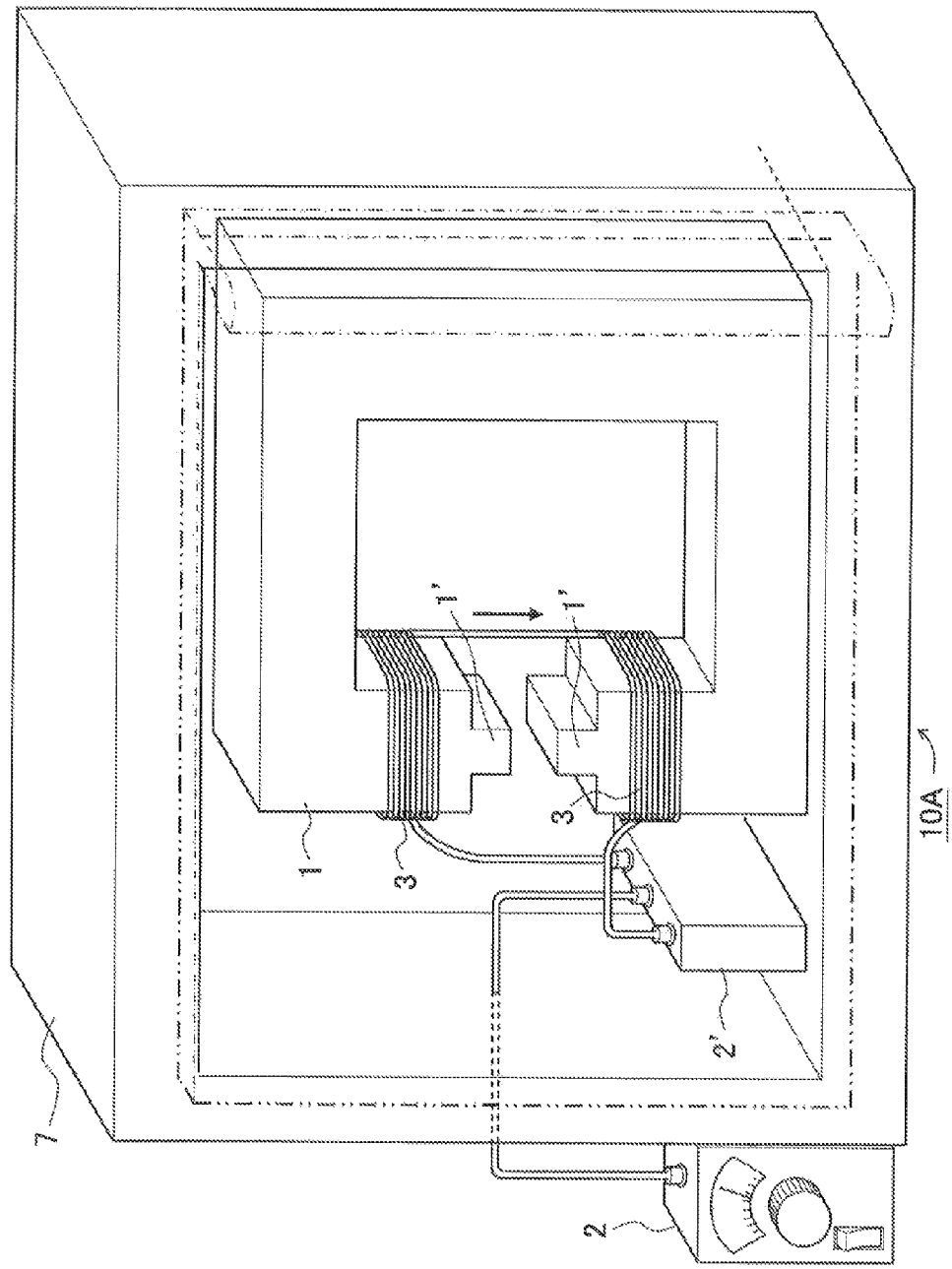

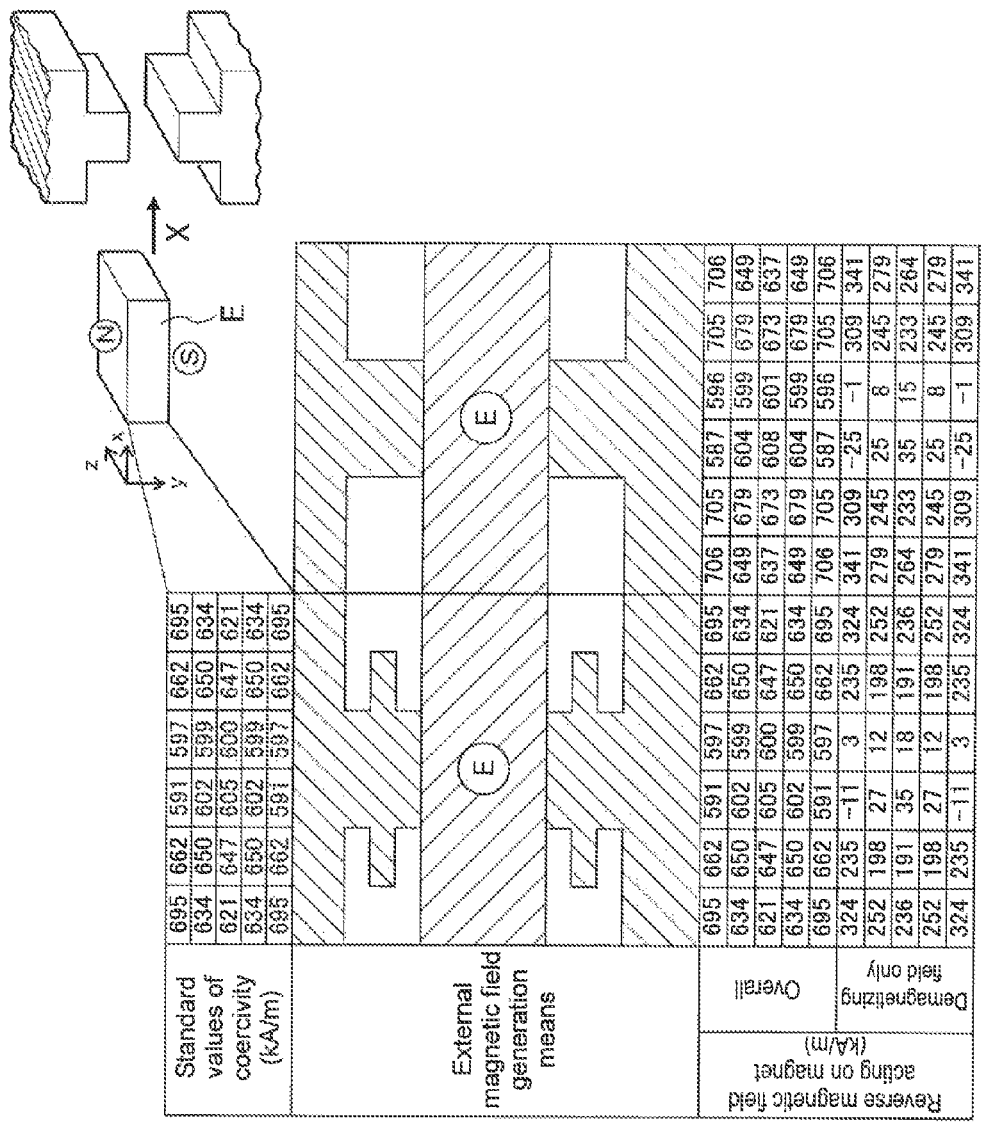

COERCIVITY PERFORMANCE DETERMINATION DEVICE FOR COERCIVITY DISTRIBUTION MAGNET

CROSS-REFERENCE TO RELATED APPLICATIONS

This application is a national phase application of International Application No. PCT/JP2010/063604, filed Aug. 11, 2010, the content of which is incorporated herein by reference.

TECHNICAL FIELD

The preset invention relates to a coercivity performance determination device for a coercivity distribution magnet which determines whether or not each part of a coercivity distribution magnet for use in a motor has a coercivity that is equal to or greater than the required coercivity.

BACKGROUND ART

A permanent magnet embedded within a rotor of an IPM motor, etc., is required to have a coercivity that makes it possible to resist demagnetization caused by an external magnetic field coming from the stator core side.

The external magnetic field acting on this permanent ma net is generally such that, with respect to a plan view of the rotor in which the permanent magnet is embedded, it is greatest at the corner parts on the stator core-side of the permanent magnet, while becoming smaller towards the center of the rotor core.

On the other hand, with respect to sintered permanent magnets, metal particles for enhancing the coercivity performance of the permanent magnet are diffused along the grain boundary from the surface thereof, and so forth. However, since rare metals, such as dysprosium, terbium, etc., are used for these metal particles, one important problem to be solved in the art from the perspective of manufacturing cost reduction for permanent magnets is how to reduce the used amount thereof while at the same time securing the desired coercivity performance.

With respect to this coercivity performance, since, as mentioned above, the magnitude of the external magnetic field that acts on a permanent magnet varies from part to part, the coercivity required of the permanent magnet also differs from part to part. Thus, with a view also to reducing the amount of rare metal used to enhance the coercivity performance, by producing a coercivity distribution magnet whose coercivity of the permanent magnet varies from part to part (i.e., having a coercivity distribution), it is possible to realize permanent magnet production wherein the amount of rare metal, e.g., dysprosium, etc., used is reduced as much as possible while meeting the required coercivity performance, and in which a reduction in production cost is achieved.

If a coercivity distribution magnet is produced through, by way of example, grain boundary diffusion, it is important that it be checked whether or not each part of this coercivity distribution magnet has the required coercivity (coercivity that varies from part to part) to guarantee product reliability.

However, it may readily be appreciated that since the coercivity is distributed, determining whether or not each part has the required coercivity is difficult and involves a time-consuming checking process.

It is noted that thus determining whether or not each part of a coercivity distribution magnet has the required coercivity is performed mainly in a quality checking stage before producing and shipping the coercivity distribution magnet.

Further, it is preferable that, in this quality checking stage, a determination as to whether or not each part of the coercivity distribution magnet has a coercivity that is equal to or greater than the required coercivity be performed in a short period of time and as inexpensively as possible.

There is disclosed in Patent Literature 1 a testing device for measuring a demagnetization state of a motor magnet, the device comprising at least: a jig that holds a motor, which comprises a stator and a rotor that is located therewithin and comprises a magnet, in such an attitude that the stator and the rotor have a given mechanical angle; a power source that passes a direct current through a coil wound around the stator; and a flux meter that measures a demagnetization state of the magnet. By employing this testing device, it is possible, without using an actual vehicle for example, to reproduce the desired temperature conditions, mechanical angle of the motor (in the case of an IPM motor, the rotation angle of a given permanent magnet with respect to a given tooth), and conduction conditions (in the case of a three-phase AC motor, the conduction states of each phase, namely U, V, and W, at a given moment). And it becomes possible to evaluate the demagnetization mode of a magnet (permanent magnet) under those conditions (e.g., how much demagnetization has occurred in which part of the magnet, how large the magnetic flux of the magnet as a whole is, etc.).

CITATION LIST

Patent Literature

Patent Literature 1: JP Patent Application Publication (Kokai) No. 2009-270926 A

SUMMARY OF INVENTION

Technical Problem

With the testing device disclosed in Patent Literature 1, it is possible to identify with precision the demagnetization state of a motor magnet without using an actual vehicle, for example.

However, in employing this testing device, a sample motor must be produced, and as many coercivity distribution magnets as are to be embedded within the rotor thereof must be prepared. By way of example, if one wanted to quickly check the quality of a coercivity distribution magnet before production and shipment, the setting of the above-mentioned conduction conditions, temperature conditions, mechanical angle conditions, etc., is not necessary at all, and it would suffice to check whether or not each part of the magnet of interest has the required coercivity by a simple method. In addition. When randomly selecting one or a plurality of coercivity distribution magnets from among a plurality of coercivity distribution magnets produced to check the quality thereof, there is no need to perform a quality checking test with respect to all of the coercivity distribution magnets that are to be employed in the motor.

Accordingly, with the testing device disclosed in Patent Literature 1, by way of example, it is difficult to determine in a short period of time whether or not each part of one coercivity distribution magnet embedded within a rotor has a coercivity that is equal to or greater than the required coercivity. Further, there is also significant room for reducing the costs involved in testing.

Thus, by way of example, development of a device capable of determining, in a short period of time and with precision, whether or not each part of one coercivity distribution magnet has the required coercivity is strongly desired.

It is noted that, with this device, specifically identifying the value of the coercivity that each part of a coercivity distribution magnet actually has is not required at all, and it is only necessary that it be possible to check whether or not each part of a coercivity distribution magnet has a coercivity that is equal to or greater than the required coercivity. This is because, in guaranteeing the coercivity performance of a coercivity distribution magnet, it suffices to be able to check whether or not each part of the coercivity distribution magnet has a coercivity that is equal to or greater than the required coercivity, in addition to which it is extremely difficult to specifically identify the coercivity that each part actually has, and doing so would require an excessive amount of time, involve effort, and potentially cause the testing device to become expensive.

The present invention is made in view of the problems mentioned above, and an object thereof is to provide a coercivity performance determination device for a coercivity distribution magnet that is capable of determining, in a short period of time, with precision, and at as low a testing cost as possible, whether or not each part of one coercivity distribution magnet has a coercivity that is equal to or greater than the required coercivity.

Solution to Problem

In order to achieve the above-mentioned object, a coercivity performance determination device for a coercivity distribution magnet according to the present invention is a coercivity performance determination device for determining whether or not each part of the coercivity distribution magnet has a coercivity that is equal to or greater than the required coercivity, the device comprising at least: a substantially C-shaped magnetic body; excitation means that generates a magnetic flow in the magnetic body; and a flux meter that measures a residual magnetic flux of the coercivity distribution magnet, wherein protrusions are respectively provided at corresponding positions on two opposing end faces of the substantially C-shaped magnetic body, the coercivity distribution magnet is held between the two protrusions to form an annular magnetic circuit comprising the substantially C-shaped magnetic body and the coercivity distribution magnet, external magnetic field generation means is formed by a magnetic region caused by the protrusions and a non-magnetic region comprising air in the periphery thereof, and a reverse magnetic field, which comprises the sum of an external magnetic field that is generated when magnetism generated by the excitation means flows through the protrusions forming the external magnetic field generation means and a demagnetizing field that the coercivity distribution magnet has, has the external magnetic field so adjusted as to correspond to the coercivity required of each part of the coercivity distribution magnet, and the residual magnetic flux when the coercivity required of each part of the coercivity distribution magnet has acted on the coercivity distribution magnet as the reverse magnetic field is measured with the flux meter to determine whether or not each part of the coercivity distribution magnet has the required coercivity.

A coercivity distribution magnet that is taken to be an object of determination by a determination device of the present invention may be a coercivity distribution magnet that is extracted from a rotor for a post-production performance check at the time of production of the magnet, at the time of production of the IPM motor which has this magnet built thereinto, at the time of production of the vehicle which has this IPM motor built thereinto, or after being placed under a given environment such as after a test drive of the vehicle, etc.

A magnetic body forming this coercivity performance determination device is substantially C-shaped, and protrusions are respectively provided at corresponding positions on two opposing end faces thereof. Here, the expression "substantially C-shaped" may refer to a shape where a portion of a frame that is rectangular in plan view is cut away, a shape where a portion of a circle (ring) or ellipse in plan view is cut away, etc.

Further, at that cut-away portion, protrusions protrude from corresponding positions on two opposing end faces, and a coercivity distribution magnet, which is the object of coercivity performance determination, is held between the two protrusions. In a state where the coercivity distribution magnet is thus held, an annular magnetic circuit is formed by the substantially C-shaped magnetic body and the coercivity distribution magnet.

Here, the external magnetic field generated by the external magnetic field generation means, which comprises this magnetic region and the non-magnetic region comprising the air in the periphery thereof, varies depending on the positions where the protrusions are thrilled on the end faces of the magnetic body, or, more specifically, depending on where, in plan view, on the end faces of the magnetic body the protrusions are located (central positions, left edges or right edges, positions closer to the left edges, positions closer to the right edges, etc.), and so forth.

By way of example, in the case of a magnet where the coercivity that the coercivity distribution magnet has is relatively high at its corner parts and relatively low at its center part, it has been identified by the present inventors that, by providing the protrusions at the center regions of the end faces of the magnetic body, an external magnetic field that forms a reverse magnetic field comparable to the required coercivity is readily formed. It is noted that the term center region as used above refers to the central ⅓ or ¼ region of the end face as seen in plan view, for example. The height of the protrusions is similar to the height of the magnetic body, and, by way of example, only their width is ⅓, ¼, etc., of the width of the magnetic body.

Of the magnetic flux that is generated from the magnet, the magnetic flux that does not go outside of the magnet and flows within the magnet against the magnetization direction of from the S-pole to the N-pole is the "demagnetizing field." The "reverse magnetic field" applied to the magnet in a direction that runs against the magnetization direction of the magnet comprises the sum of this "demagnetizing field" and the "external magnetic field" generated at the external magnetic field generation means.

Further, since "coercivity" is a physical property value representing up to what level of reverse magnetic field may be withstood without resulting in demagnetization when a reverse magnetic field is applied to a magnet, an external magnetic field is generated as desired to form a reverse magnetic field corresponding to the required coercivity, where the required coercivity varies from part to part, and this is applied to a coercivity distribution magnet which is the object of a test and which is held and secured between the protrusions.

As the magnetism that has flowed through the substantially C-shaped magnetic body passes through the external magnetic field generation means, the magnetism is going to pass mainly through the protrusions of the magnetic regions. Whereas a uniform magnetic field (external magnetic field) was being generated while the magnetism was flowing through the magnetic body, it is possible, as the magnetism passes through the external magnetic field generation means, to disturb the external magnetic field in the desired non-uniform manner.

More specifically, by adjusting the width and height of the protrusions (magnetic regions) as seen in plan view, while at the same time adjusting the positions at which the protrusions are disposed on the end faces, the ratio of the width of the protrusions to the entire width of the end faces, etc., the width and length of the non-magnetic regions comprising the air that exists in the periphery of the protrusions, which are the magnetic regions, the ratio of the non-magnetic regions to the entire width with respect to the end faces as seen in plan view, etc., are also adjusted simultaneously. Thus, as a result of altering the lengths, widths, disposed positions, ratios, etc, of both, the magnitude, as well as the manner and extent of non-uniformity, of the generated external magnetic field are adjusted.

The demagnetizing field of the parts facing, of the coercivity distribution magnet held between the protrusions, the non-magnetic regions in particular exhibits a tendency to become greater relative to the demagnetizing field of the parts facing the magnetic regions due to the external magnetic field generation means comprising the magnetic regions and non-magnetic regions adjacent to the coercivity distribution magnet. By way of example, in the case of an external magnetic field generation means in which the protrusions forming the magnetic regions are provided in the centers of the end faces of the magnetic body, and in which the non-magnetic regions comprising air are provided in the periphery thereof, the demagnetizing field at the center of the coercivity distribution magnet held between the protrusions is small, and the demagnetizing field at the periphery becomes large. It is noted that this tendency applies to magnets in general, and a distribution in magnitude is generated for the demagnetizing field within a magnet depending on the density (distribution) of the magnetic body in the periphery of the magnet.

As such, with a coercivity performance determination device of the present invention, in particular, for a region of a coercivity distribution, magnet where the demagnetizing field is large (this is adjusted through the configuration of the external magnetic field generation means), while effectively utilizing that demagnetizing field, magnetism generated by an excitation means, an external magnetic field that is formed as this magnetism flows, etc., are adjusted in such a manner that the reverse magnetic field, which comprises the sum of the non-uniform external magnetic field generated at the above-mentioned external magnetic field generation means and this demagnetizing field, becomes a value comparable to the coercivity required of each part of the coercivity distribution magnet.

Here, if, for example, the coercivity distribution magnet that is the object of determination comprises a permanent magnet embedded within a rotor of an IPM motor, the expression "coercivity required of each part of the coercivity distribution magnet" may refer to a coercivity that is equal to or greater than the reverse magnetic field to which each part of this permanent magnet (e.g., each divisional region of the permanent magnet, where the permanent magnet is virtually divided into a predetermined number of blocks, and so forth) is exposed within the rotor. By way of example, the sum of the magnetic field that enters from the stator side, the demagnetizing field generated within the rotor, etc., becomes the coercivity required of each part. Further, since the magnetic field entering from the stator side acts more readily on the corner parts of the permanent magnet embedded within the rotor, for example, the coercivity required of the corner parts of the permanent magnet generally becomes higher relative to the other parts.

Thus, instead of forming the coercivity required of each part of a coercivity distribution magnet solely with an external magnetic field generated as a result of magnetism generated by an excitation means passing through an external magnetic field generation means, a reverse magnetic field corresponding to the coercivity required of each part of the coercivity distribution magnet is formed while effectively utilizing the demagnetizing field that the coercivity distribution magnet itself has. Consequently, it is made unnecessary to supply a large current from a power source constituting the excitation means.

Further, by forming the reverse magnetic field corresponding to the coercivity required of each part of the coercivity distribution magnet from the generated external magnetic field and the demagnetizing field, having it act on the coercivity distribution magnet, and examining with a flux meter whether or not demagnetization has occurred, it is determined whether or not each part of the coercivity distribution magnet has the required coercivity.

In this case, if the coercivity distribution magnet placed within the determination device has a coercivity greater than the reverse magnetic field applied thereto corresponding to the required coercivity, the magnet does not demagnetize, and thus the magnetic flux does not decrease.

On the other hand, if the coercivity distribution magnet only has a coercivity equal to or less than the applied reverse magnetic field corresponding to the required coercivity, the magnet demagnetizes, and thus the magnetic flux decreases.

Accordingly, by measuring the residual magnetic flux with a flux meter, that is, by measuring whether or not demagnetization has occurred, it becomes possible to determine whether or not each part of the coercivity distribution magnet has a coercivity that is equal to or greater than the required coercivity.

Further, the term "coercivity performance" as used herein refers to "having a coercivity equal to or greater than the required coercivity," and it does not call for an identification of a specific coercivity value.

Thus, according to the above-mentioned coercivity performance determination device, only one coercivity distribution magnet is placed in the determination device, a reverse magnetic field corresponding to the coercivity required of each part is formed from an external magnetic field that is generated when predetermined magnetism is passed through the formed magnetic circuit and the demagnetizing field that the coercivity distribution magnet has, and this is applied to the coercivity distribution magnet that is the object of determination. As a result, it is promptly determined whether or not each part of the coercivity distribution magnet has a coercivity that is equal to or greater than the required coercivity, and quality may be guaranteed with respect to coercivity performance in a short period of time.

It is noted that a coercivity distribution magnet that is taken to be an object of determination by a coercivity performance determination device of the present invention may include a permanent magnet used in a motor and that has a coercivity distribution, and it may include a ternary neodymium magnet, where iron and boron are added to neodymium, a samarium-cobalt magnet comprising a binary alloy of samarium and cobalt, a ferrite magnet made mainly from an iron oxide powder, an alnico magnet made from aluminum, nickel, cobalt, etc., and so forth.

Here, the configuration may also be such that a flange comprising a magnetic body is provided to protrude from the side of each of the protrusions forming the external magnetic field generation means and to extend into the non-magnetic region, and such that the generated external magnetic field is adjusted by these flanges.

By thus having a flange protrude from somewhere in the middle of the protrusion and into the nonmagnetic region comprising the air in the periphery thereof the magnitude of the external magnetic field and the manner and extent of the non-uniformity thereof may be adjusted by adjusting the positions at which the flanges protrude from the protrusions, the width of the flanges, and the protruding length of the flanges.

In addition, a specific configuration of the excitation means may include an excitation means comprising a coil formed around the magnetic body and a power source that passes a direct current through this coil.

As discussed above, with a coercivity performance determination device of the present invention, the demagnetizing field that the magnet itself has is effectively utilized, while at the same time forming the reverse magnetic field corresponding to the coercivity required of each part of the coercivity distribution magnet from the sum of this demagnetizing field and the external magnetic field generated at the external magnetic field generation means. Further, as discussed above, due to the external magnetic field generation means comprising the magnetic regions and non-magnetic regions adjacent to the coercivity distribution magnet, of the coercivity distribution magnet held between the protrusions, particularly the demagnetizing field of the parts facing the non-magnetic regions exhibits a tendency to become greater relative to the demagnetizing field of the parts facing the magnetic regions.

Accordingly, with respect to a coercivity distribution magnet that is the object of determination, particularly for a region with a large demagnetizing field, by forming the reverse magnetic field by effectively utilizing this demagnetizing field, it becomes no longer necessary to pass a large current from a power source through the coil to form the external magnetic field corresponding to the coercivity required of each part of the coercivity distribution magnet.

Further, a preferred embodiment of a coercivity performance determination device according to the present invention further comprises a thermostatic chamber that places at least the coercivity distribution magnet under a simulated-temperature atmosphere.

The coercivity of a magnet has a tendency to vary with temperature. In addition, distributed coercivity desired under a given temperature condition is generally required of the respective parts of a coercivity distribution magnet.

More specifically, by way of example, for temperature conditions of a motor mounted within an actual vehicle, desired temperature conditions of the motor, such as temperature conditions during engine operation in severe heat, temperature conditions during engine operation in cold weather regions, etc., are reproduced within a thermostatic chamber, and the coercivity and demagnetization mode of each part of the coercivity distribution magnet are evaluated under this simulated temperature atmosphere. Thus, it becomes possible to perform a determination of the coercivity performance of a coercivity distribution magnet which takes into account the anticipated temperature conditions.

Advantageous Effects of Invention

As can be understood from the description above, according to a coercivity performance determination device for a coercivity distribution magnet of the present invention, a reverse magnetic field corresponding to the coercivity required of each part of the coercivity distribution magnet is formed with an external magnetic field generated when magnetism caused by an excitation means flows through an external magnetic field generation means and the demagnetizing field that the magnet itself has, and whether or not demagnetization occurs in, or the residual magnetic flux of, each part when this is applied to the coercivity distribution magnet is measured. Thus, with inexpensive performance test costs and in a short period of time, it may be determined whether or not each part of the coercivity distribution magnet has a coercivity equal to or greater than the required coercivity.

BRIEF DESCRIPTION OF DRAWINGS

FIG. 5 is a schematic diagram illustrating another embodiment of a coercivity performance determination device of the present invention.

FIG. 6 is a diagram indicating examples of standard values of distributed coercivity with respect to an analytical model, and analysis results indicating values of the reverse magnetic field and values of the demagnetizing field thereof with the external magnetic field generation means varied.

REFERENCE SIGNS LIST

Figure 1:
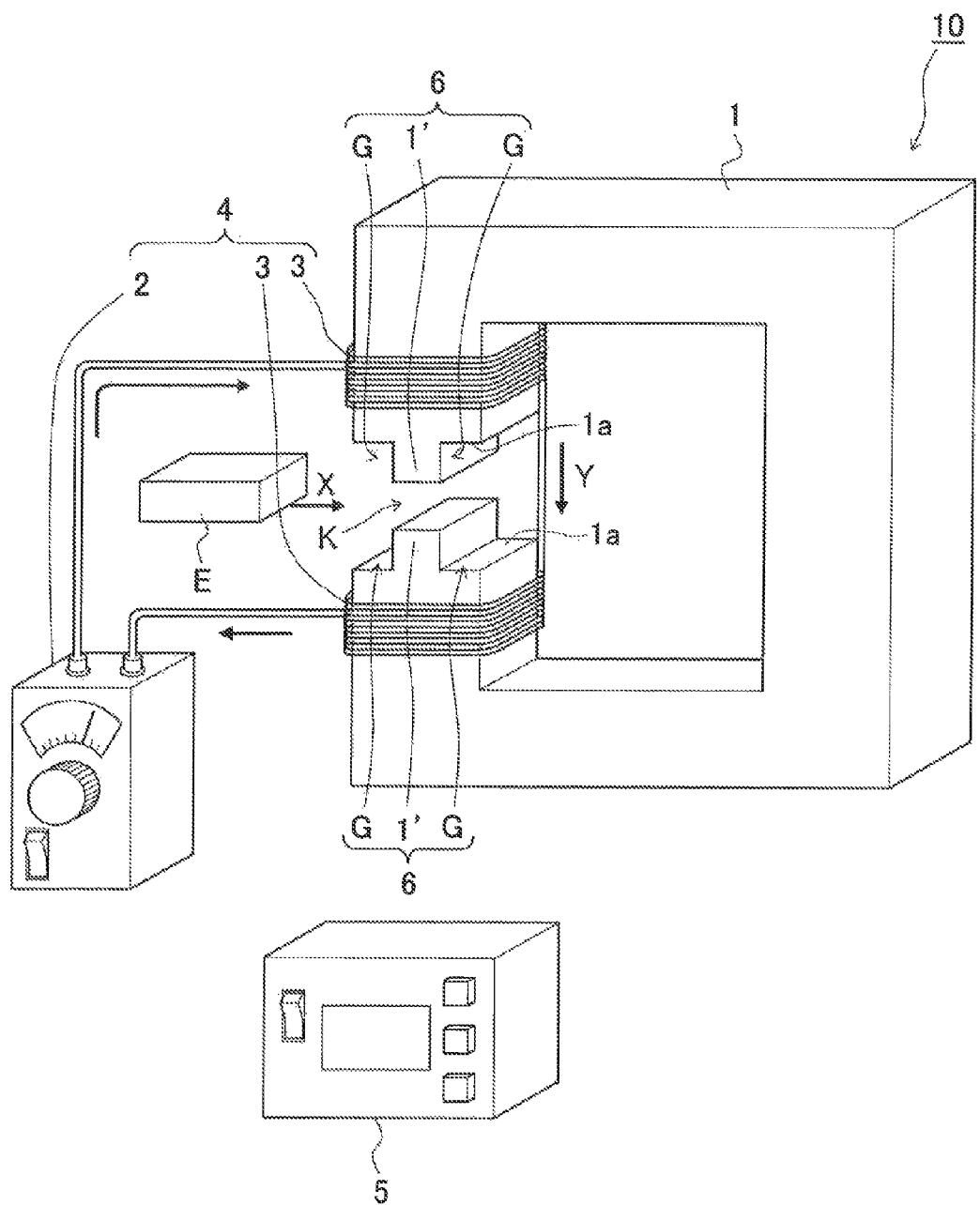
FIG. 1 is a schematic diagram illustrating an embodiment of a coercivity performance determination device of the present invention.

1: Magnetic body
1a: End face
1'; Protrusion (magnetic region)
1": Flange
2: Power source
2': Terminal block
3: Coil.
4: Excitation means
5: Flux meter
6, 6A: External magnetic field generation means
7: Thermostatic chamber
10, 10A: Coercivity performance determination device
E: Coercivity distribution magnet (permanent magnet)
G: Non-magnetic region
K: Gap
J: Magnetism
H: Demagnetizing field
GJ: External magnetic field

DESCRIPTION OF EMBODIMENTS

Embodiments of the present invention are described below with reference to the drawings. Although the protrusions are provided in the center regions of the end faces of the magnetic body in the illustrated examples, the configuration of the external magnetic field generation means is of course by no means limited to those of the illustrated examples, and, for example, in generating an external magnetic field forming a reverse magnetic field corresponding to the coercivity required of each part of a coercivity distribution magnet, protrusions may be provided at edge parts of the end faces, at regions closer to the edge parts, and so forth.

Figure 2:
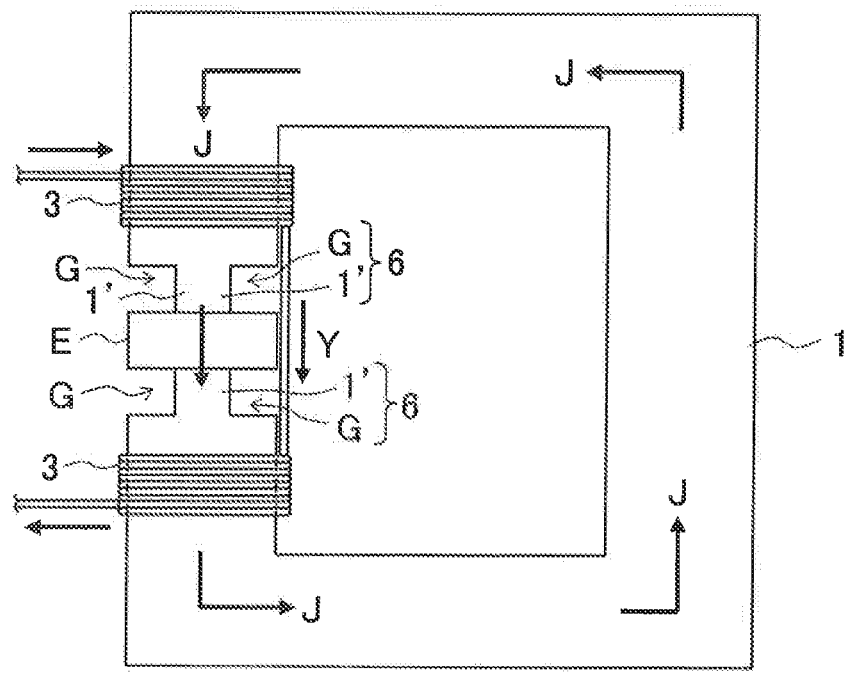
FIG. 2(a) is a diagram illustrating a state where a coercivity distribution magnet is placed in the coercivity performance determination device shown in FIG. 1 and magnetism generated by an excitation means is flowing through a magnetic circuit. (b) and (c) are diagrams illustrating embodiments of a center region where a protrusion is formed.
Figure 2:
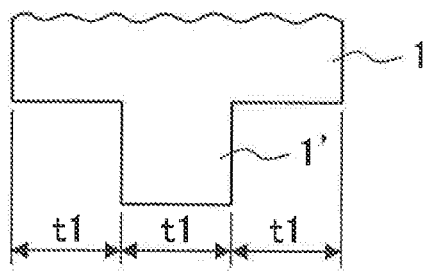
Figure 2:
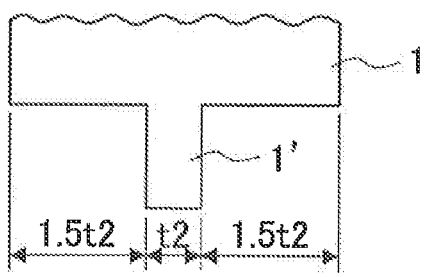

FIG. 1 schematically shows a coercivity performance determination device of the present invention which determines the coercivity performance of a coercivity distribution magnet. FIG. 2a is a diagram illustrating a state where a coercivity distribution magnet is placed in the coercivity performance determination device shown in FIG. 1 and where magnetism generated by an excitation means flows through the magnetic circuit, FIGS. 2b and c are both diagrams illustrating embodiments of the center regions where the protrusions are formed.

Coercivity performance determination device 10 shown in FIG. 1 generally comprises: a magnetic body 1 that is substantially C-shaped in plan view; coils 3, 3 formed around the magnetic body 1; a power source 2 that supplies a current to the coils 3; and a flux meter 5 that measures the residual magnetic flux of, or whether or not demagnetization has occurred in, a coercivity distribution magnet E when a reverse magnetic field is applied to the coercivity distribution magnet.

At a portion of the magnetic body 1, to define a gap K into which the coercivity distribution magnet E is to be inserted and placed (X direction), protrusions 1' that protrude from the center regions of two opposing end faces 1a towards the gap K are provided. As shown in FIG. 2a, magnetism flows through the protrusions 1' to pass through the coercivity distribution magnet E, and these protrusions 1' form magnetic regions.

On the other hand, in the periphery of these protrusions 1' are non-magnetic regions G comprising air. The magnetic regions comprising the protrusions 1' and these non-magnetic regions G form an external magnetic field generation means 6.

In the illustrated example, the coil 3 is formed to the rear of each protrusion 1'. A conductive wire is provided in such a manner that the conductive wire coming from the power source 2 is wound to form one of the coils 3, the conductive wire extending from this coil 3 further forms the other coil 3, and the conductive wire extending from this coil 3 returns to the power source 2. As the direct current supplied from the power source 2 sequentially flows through the coils 3, 3 (Y direction), there is generated magnetism J that flows through an annular magnetic circuit comprising the magnetic body 1 and the coercivity distribution magnet E held between the protrusions 1', 1'.

The coercivity distribution magnet E is a magnet formed in a configuration where coercivity is distributed as desired while diffusing dysprosium, terbium, etc., along the grain boundary from the surface of a sintered permanent magnet embedded in, for example, an unillustrated rotor forming an IPM motor, and so forth. Further, this permanent magnet may include a ternary neodymium magnet in which iron and boron are added to neodymium, a samarium-cobalt magnet comprising a binary alloy of samarium and cobalt, a ferrite magnet made mainly from an iron oxide powder, an alnico magnet made from aluminum, nickel, cobalt, etc., and so forth.

While the illustrated magnetic body 1 is of a shape where a portion of a rectangular frame is cut away, besides the above, it may also be of a shape where a portion of a circle (ring) or ellipse in plan view is cut away, among others.

In addition, with respect to the protrusions 1', their width may be adjusted as deemed appropriate, such as a configuration where, as shown in FIG. 2h, they have width t1, which is ⅓ of the width of the magnetic body 1, at center regions of the end faces 1a of the magnetic body 1, or a configuration where, as shown in FIG. 2c, they have width t2, which is ¼ the width of the magnetic body 1, at center regions of the end faces 1a of the magnetic body 1, and so forth.

More specifically, with respect to the width and protruding length of the protrusions 1', as will be discussed later, in applying to a coercivity distribution magnet a reverse magnetic field (the sum of an external magnetic field and the demagnetizing field of the magnet) corresponding to the required coercivity with a distributed standard, by adjusting the width and protruding length of the protrusions 1', the width and length of the non-magnetic regions in the periphery thereof are also simultaneously adjusted. Through such adjustments, the value of the external magnetic field, and the value of the reverse magnetic field comprising the demagnetizing field and this external magnetic field vary. Consequently, the width and protruding length of the protrusions 1' are adjusted in such a manner that the reverse magnetic field comprising the distributed coercivity corresponds to the coercivity with a distributed standard.

It is noted that since the value of the external magnetic field also varies with the value of the current forming the magnetism, the configuration of the external magnetic field generation means 6 also takes the current value into account, and the external magnetic field forming the reverse magnetic field to be applied to the coercivity distribution magnet is thus adjusted.

Figure 3:
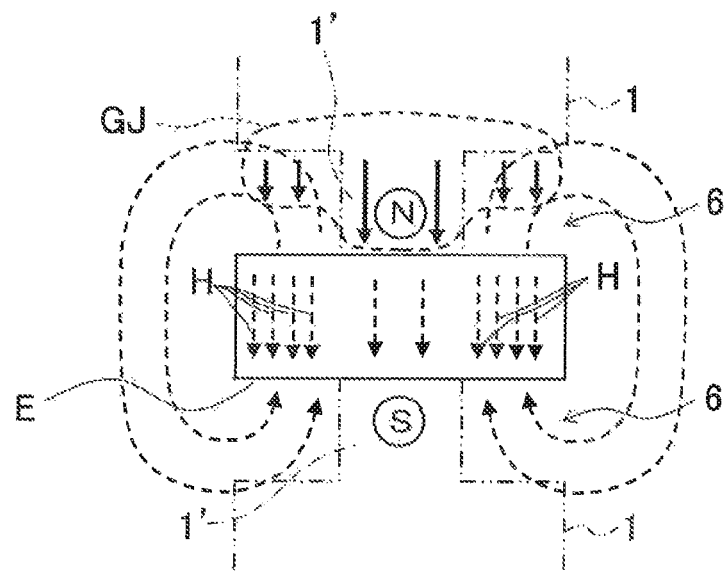
FIG. 3 is a schematic diagram illustrating a demagnetizing field within a coercivity distribution magnet and an external magnetic field generated by an external magnetic field generation means.

FIG. 3 is a schematic diagram illustrating a demagnetizing field within a coercivity distribution magnet, and an external magnetic field generated by an external magnetic field generation means.

As shown in this diagram, with respect to the coercivity distribution magnet E, of the magnetic flux generated from the magnet, there is generated a demagnetizing field H where magnetic flux does not go outside of the magnet and flows against the magnetization direction (S pole→N pole) within the magnet.

The demagnetizing field H exhibits a tendency to be smaller the more closed the magnetic circuit is. In the case of a C-shaped magnetic circuit such as that in the diagram, the more the periphery of the N-pole face and S-pole face of the magnetic poles is filled with a soft magnetic body, the smaller the demagnetizing field becomes. Conversely, the less dense the soft magnetic body is, the greater the demagnetizing field becomes. It is noted that this tendency applies to magnets in general, and is not particular to coercivity distribution magnets.

With the coercivity performance determination device 10 shown in the diagram, at the peripheral regions of the coercivity distribution magnet E corresponding to the non-magnetic regions of the external magnetic field generation means 6, a relatively large demagnetizing field H is formed. Thus, utilizing this demagnetizing field H effectively, the sum of the external magnetic field GJ generated at the external magnetic field generation means 6 and the demagnetizing field H is applied to the coercivity distribution magnet E as a reverse magnetic field corresponding to the coercivity with a distributed standard required of the coercivity distribution magnet.

For the external magnetic field GJ, because the external magnetic field generation means 6 comprises magnetic regions and non-magnetic regions, it is possible to form a non-uniform magnetic field.

Here, by way of example, if the coercivity distribution magnet is a magnet embedded within a rotor of an IPM motor, the expression "coercivity with a distributed standard" refers to the sum of the magnetic field entering from the stator core and the demagnetizing field within the magnet, and, more particularly, to the required coercivity that varies from part to part since the magnetic field entering from the stator core varies significantly in terms of the magnitude of the magnetic field acting on each part of the coercivity distribution magnet within the rotor, which causes the coercivity required of the permanent magnet to vary from part to part.

By utilizing the demagnetizing field H that the coercivity distribution magnet E has, it becomes possible to form the external magnetic field forming the reverse magnetic field corresponding to the coercivity with a distributed standard, while also reducing as much as possible the value of the current supplied from the power source 2 to the coils 3 to form magnetism.

The coercivity with a distributed standard formed of the demagnetizing field H that the coercivity distribution magnet E has and the external magnetic field GJ caused by the external magnetic field generation means is applied as a reverse magnetic field to the coercivity distribution magnet E held between the protrusions 1', 1'.

Further, by measuring with the flux meter 5 the residual magnetic flux of the coercivity distribution magnet E after the reverse magnetic field has been applied, whether or not each part of the coercivity distribution magnet E has a coercivity equal to or greater than the required coercivity, that is, the coercivity performance of the coercivity distribution magnet E, is determined.

If the coercivity distribution magnet F placed within the coercivity performance determination device 10 has a coercivity that is greater than the applied reverse magnetic field corresponding to the required coercivity, this magnet does not demagnetize, and the magnetic flux consequently does not decrease. However, if it only has a coercivity that is equal to or less than the applied reverse magnetic field corresponding to the required coercivity, the magnet demagnetizes, and the magnetic flux consequently decreases.

Figure 4:
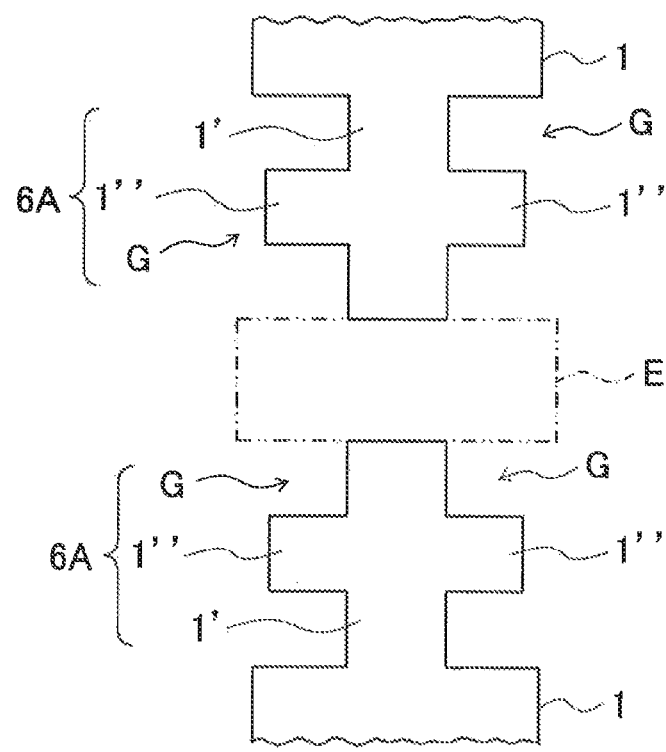
FIG. 4 is a schematic diagram illustrating another embodiment of an external magnetic field generation means.

FIG. 4 is a schematic diagram illustrating another embodiment of the external magnetic field generation means. Specifically, flanges 1" comprising a magnetic body molded integrally with the protrusions 1' protrude from the sides of the protrusions 1', and these extend into the non-magnetic regions G to form an external magnetic field generation means 6A.

For these flanges 1", too, by varying their width, protruding length, the positions at which they protrude from the protrusions 1', etc., the manner of non-uniformity of and the magnitude of the generated external magnetic field may be varied.

FIG. 5 is a schematic diagram illustrating another embodiment of a coercivity performance determination device of the present invention. Coercivity performance determination device 10A shown in the diagram has the magnetic body 1 disposed in a thermostatic chamber 7. The power source 2 is disposed outside of the thermostatic chamber 7. A conductive wire extending from the power source 2 leads to a terminal block 2' within the thermostatic chamber 7. A conductive wire extends to the two coils 3, 3 that are continuous from the terminal block 2', and a current is sequentially supplied from one of the coils 3, 3 to the other.

With the thermostatic chamber 7, the desired temperature environment of a motor may be reproduced, such as the temperature environment of a motor mounted within an actual vehicle, or more specifically, a temperature environment during engine operation in severe heat, a temperature environment during engine operation in cold weather regions, etc.

Since the coercivity of a magnet generally tends to vary with temperature, coercivity of a given distribution under the desired temperature environment is often required of each part of a coercivity distribution magnet.

In such cases, by simulating the desired temperature environment in the thermostatic chamber 7 using the coercivity performance determination device 10A, and determining whether or not each part of the coercivity distribution magnet has a coercivity equal to or greater than the coercivity required under that temperature environment, the coercivity performance of the coercivity distribution magnet prior to production/shipment may be identified with greater precision, and it may be assessed quickly whether or not it has a coercivity that is equal to or greater than the required coercivity.

[Examples of distributed coercivity standard values with respect to an analytical model, and analyses and results indicating values of the reverse magnetic field when the external magnetic field generation means is varied and values of the demagnetizing field contained therein]

As simulated in FIG. 6, the present inventors set standard values of coercivity with respect to a coercivity distribution magnet disposed within a magnetic body, and, through analysis, identified the reverse magnetic field (overall magnetic field) acting on a coercivity distribution magnet model in a case where the coercivity performance determination device comprises an external magnetic field generation means comprising flanged protrusions, and the demagnetizing field contained therein.

Similarly, through analysis, the present inventors identified the reverse magnetic field (overall magnetic field) acting on a coercivity distribution magnet model in a case where the determination device comprises an external magnetic field generation means comprising protrusions with no flanges, and the demagnetizing field contained therein.

For both of the two coercivity distribution magnet models comprising the external magnetic field generation means, the analysis results obtained when currents of the same value are passed are indicated. From the results of both, it can be seen that the value of the demagnetizing field as well as the value of the reverse magnetic field vary depending on whether or not the protrusions forming the external magnetic field generation means comprise a flange.

In addition, with respect to a coercivity determination device of the present invention, it can be seen that because the non-magnetic regions of the external magnetic field generation means thereof are provided at peripheral positions, the peripheral regions of the coercivity distribution magnet have a greater demagnetizing field relative to the center region, and both the value of the demagnetizing field and the value of the reverse magnetic field as a whole are greater in the analytical model whose protrusions do not comprise a flange.

According to the above-mentioned coercivity performance determination device of the present invention, whether or not each part of one coercivity distribution magnet has a coercivity that is equal to or greater than the required coercivity may be determined in a short period of time and with precision.

Further, in determining the coercivity performance of a coercivity distribution magnet, since there is no need to make a sample motor, or to make as many samples of coercivity distribution magnets as will be disposed within the rotor thereof, the coercivity performance of the coercivity distribution magnet may be determined with low testing costs.

Although embodiments of the present invention have been discussed in detail above using the drawings, specific features are by no means limited to those of these embodiments. Design modifications, etc., made within a scope that does not depart from the spirit of the present invention are encompassed by the present invention.

The invention claimed is:

1. A coercivity performance determination device for determining whether or not each part of a coercivity distribution magnet has a coercivity that is equal to or greater than a required coercivity, the coercivity performance determination device comprising at least:
    a substantially C-shaped magnetic body;
    excitation means that generates a magnetic flow in the magnetic body; and
    a flux meter that measures a residual magnetic flux of the coercivity distribution magnet, wherein
    protrusions are respectively provided at corresponding positions on two opposing end faces of the substantially C-shaped magnetic body, and the coercivity distribution magnet is held between the two protrusions to form an annular magnetic circuit comprising the substantially C-shaped magnetic body and the coercivity distribution magnet,
    external magnetic field generation means is formed by a magnetic region caused by the protrusions and a non-magnetic region comprising air in the periphery thereof, and
    a reverse magnetic field, which comprises the sum of an external magnetic field that is generated when magnetism generated by the excitation means flows through the protrusions forming the external magnetic field generation means and a demagnetizing field that the coercivity distribution magnet has, has the external magnetic field so adjusted as to correspond to the coercivity required of each part of the coercivity distribution magnet, and the residual magnetic flux when the coercivity required of each part of the coercivity distribution magnet has acted on the coercivity distribution magnet as the reverse magnetic field is measured with the flux meter to determine whether or not each part of the coercivity distribution magnet has the required coercivity.

2. The coercivity performance determination device for a coercivity distribution magnet according to claim 1, wherein the protrusions are respectively provided in center regions of the two opposing end faces of the substantially C-shaped magnetic body.

3. The coercivity performance determination device for a coercivity distribution magnet according to claim 1, wherein a flange comprising a magnetic body protrudes from a side of the protrusions forming the external magnetic field generation means and extends into the non-magnetic region, and the generated external magnetic field is adjusted by the flange.

4. The coercivity performance determination device for a coercivity distribution magnet according to claim 1, wherein the excitation means comprises:
    a coil formed around the magnetic body; and
    a power source that passes a direct current through the coil.

5. The coercivity performance determination device for a coercivity distribution magnet according to claim 1, further comprising a thermostatic chamber that places at least the coercivity distribution magnet under a simulated temperature atmosphere.

* * * * *